US012199635B2

(12) United States Patent
Bioglio et al.

(10) Patent No.: US 12,199,635 B2
(45) Date of Patent: Jan. 14, 2025

(54) AUTOMORPHISM-BASED POLAR ENCODING AND DECODING

(71) Applicant: HUAWEI TECHNOLOGIES CO., LTD., Shenzhen (CN)

(72) Inventors: Valerio Bioglio, Boulogne Billancourt (FR); Charles Pillet, Boulogne Billancourt (FR); Ingmar Land, Boulogne Billancourt (FR)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 18/450,203

(22) Filed: Aug. 15, 2023

(65) Prior Publication Data

US 2023/0387940 A1 Nov. 30, 2023

Related U.S. Application Data

(63) Continuation of application No. PCT/EP2021/053710, filed on Feb. 16, 2021.

(51) Int. Cl.
*H03M 13/11* (2006.01)
*H03M 13/00* (2006.01)
*H03M 13/09* (2006.01)

(52) U.S. Cl.
CPC ....... *H03M 13/118* (2013.01); *H03M 13/091* (2013.01); *H03M 13/616* (2013.01)

(58) Field of Classification Search
CPC ... H04L 1/0041; H04L 1/0057; H04L 1/0061; H03M 13/13; H03M 13/091; H03M 13/118; H03M 13/616
See application file for complete search history.

(56) References Cited

U.S. PATENT DOCUMENTS

| 2018/0248655 A1* | 8/2018 | Belfiore | H03M 13/13 |
| 2020/0083984 A1* | 3/2020 | Shen | H04L 1/0057 |
| 2020/0412385 A1* | 12/2020 | Arikan | H04L 1/0041 |

OTHER PUBLICATIONS

Pillet et al., Polar codes for automorphism ensemble decoding, arXiv:2102.08250v2, pp. 1 to 6. (Year: 2021).*

(Continued)

*Primary Examiner* — Shelly A Chase
(74) *Attorney, Agent, or Firm* — Leydig, Voit & Mayer, Ltd.

(57) ABSTRACT

The present disclosure relates generally to the field of data encoding and decoding, and particularly to automorphism-based polar encoding and decoding apparatuses and methods, as well as computer program products embodying the method steps in the form of computer codes. More specifically, polar codes are designed such that their frozen bits support automorphisms described by a binary upper triangular matrix having a diagonal including at least one of zeros and units. Codewords generated using these polar codes may be subsequently subjected to automorphism-based polar decoding in an efficient manner and with a lower decoding latency compared to the conventional Successive Cancellation List decoding algorithms. Furthermore, the efficiency of the automorphism-based polar decoding may be increased even more if the automorphisms are based on matrix elements arranged above the diagonal in a vicinity of a bottom right corner of the binary upper triangular matrix.

12 Claims, 10 Drawing Sheets

(56) References Cited

OTHER PUBLICATIONS

Yao et al., A deterministic algorithm for computing the weight distribution of polar codes., IEEE, pp. 1 to 6. (Year: 2021).*

Arikan et al., "Channel Polarization: A Method for Constructing Capacity-Achieving Codes for Symmetric Binary-Input Memoryless Channels," IEEE Transactions on Information Theory, vol. 55, No. 7, total 23 pages, Institute of Electrical and Electronics Engineers, New York, New York (Jul. 2009).

Tal et al., "List Decoding of Polar Codes," IEEE Transactions on Information Theory, vol. 61, No. 5, total 11 pages, Institute of Electrical and Electronics Engineers, New York, New York (May 2012).

Afisiadis et al., "A Low-Complexity Improved Successive Cancellation Decoder for Polar Codes," Asilomar Conference on Signals, total 5 pages, Institute of Electrical and Electronics Engineers, New York, New York (Nov. 2014).

Geiselhart et al., "Automorphism Ensemble Decoding of Reed-Muller Codes," arXiv:2012.07635v1, total 14 pages, (Dec. 2020).

Bardet et al., "Algebraic Properties of Polar Codes from a New Polynomial Formalism," IEEE International Symposium on Information Theory (ISIT), arxiv:1601.06215v2, total 18 pages, Institute of Electrical and Electronics Engineers, New York, New York (Feb. 2016).

Vangala et al., "A Comparative Study of Polar Code Constructions for the AWGN Channel," arXiv:1501.02473v1, total 9 pages (Jan. 2015).

Bioglio et al., "Design of Polar Codes in 5G New Radio," IEEE Communications Surveys and Tutorials, arXiv:1804.04389v3, total 12 pages, Institute of Electrical and Electronics Engineers, New York, New York (Jan. 2020).

* cited by examiner

AUTOMORPHISM-BASED POLAR ENCODING AND DECODING

CROSS-REFERENCE TO RELATED APPLICATIONS

This application is a continuation of International Application No. PCT/EP2021/053710, filed on Feb. 16, 2021, the disclosure of which is hereby incorporated by reference in its entirety.

TECHNICAL FIELD

The present disclosure relates generally to the field of data encoding and decoding, and particularly to automorphism-based polar encoding and decoding apparatuses and methods, as well as computer program products embodying the method steps in the form of computer codes.

BACKGROUND

Polar codes are known for their ability to achieve the capacity of symmetric discrete memoryless channels with an explicit construction and a computationally efficient Successive Cancellation (SC), SC List (SCL), or Cyclic Redundancy Check (CRC)-aided SCL decoding algorithm. The basic idea of the polar codes is to present a physical communication channel as a plurality of polarized synthetic (or virtual) bit channels sorted in order of channel capacity or reliability. This is known as the channel polarization phenomenon. Information bits are then transmitted only on those bit channels which are almost noiseless, i.e. have channel reliabilities tending to 1 as a code length increases, while frozen bits or, in other words, bits fixed to a predefined value (usually "0") are transmitted on the remaining (noisy) bit channels having channel reliabilities tending to 0 as the code length increases. Thus, the construction of the polar codes involves finding such noiseless channels based on the channel reliabilities.

Codewords generated using polar codes are usually decoded based on the SC decoding algorithm, according to which a polar decoder successively attempts to deduce a value of each encoded bit. The SCL and CRC-aided SCL decoding algorithms are enhanced versions of the SC decoding algorithm, which provide a better decoding performance. However, the successive nature of the polar decoders usually used in these decoding algorithms causes their still high decoding latency.

To reduce the decoding latency, it is possible to use a different decoding algorithm based on the symmetries of the polar code itself, i.e. its automorphism group. However, such automorphism-based decoding has been successfully applied only to Reed-Muller codes and Bose-Chaudhuri-Hocquenghem codes. It has not yet been possible to successfully use the automorphism group of the polar codes in the decoding process. This is due to the incomplete conventional knowledge of the nature of the automorphism group of the polar codes, which impedes the application of automorphism ensemble decoders to these codes.

SUMMARY

This summary is provided to introduce a selection of concepts in a simplified form that are further described below in the detailed description. This summary is not intended to identify key features of the present disclosure, nor is it intended to be used to limit the scope of the present disclosure.

Exemplary embodiments of the present disclosure provide for automorphisms of a polar code to be efficiently used in encoding and decoding processes.

According to a first aspect, an encoding apparatus is provided, which comprises a data storage and at least one processor. The data storage comprises processor-executable instructions which, when executed by the at least one processor, cause the at least one processor to operate as follows. The at least one processor receives an information word comprising information bits and generates a codeword by applying a polar code to the information word. The codeword comprises a linear combination of the information bits and frozen bits of the polar code. The frozen bits are configured to support a predefined set of automorphisms that provides a mapping of the codeword of the polar code to at least one other codeword of the polar code. The predefined set of automorphisms is based on a binary upper triangular matrix having a diagonal including at least one of zeros and units (ones). The at least one processor then transmits the codeword over a communication channel. Due to the frozen bits thus configured, automorphism-based polar decoding may be subsequently applied to the codeword on the receiving or decoding side in an efficient manner and with a low decoding latency.

In one embodiment of the first aspect, the predefined set of automorphisms comprises affine transformations derived from the binary upper triangular matrix. By using the affine transformations based on the binary upper triangular matrix, it is possible to increase the efficiency of the subsequent automorphism-based polar decoding of the codeword.

In one embodiment of the first aspect, the predefined set of automorphisms is substantially derived from matrix elements arranged above the diagonal in a vicinity of a bottom right corner of the binary upper triangular matrix. The automorphisms based on these matrix elements may improve Block Error Rate (BLER) performance under the subsequent automorphism-based polar decoding.

In one embodiment of the first aspect, the polar code has a dimension K equal to a number of the information bits of the information word, and the at least one processor is further configured, before generating the codeword, to design the polar code of the dimension K by: receiving a predetermined polar code having a dimension K-s, where s<K; and increasing the dimension K-s of the predetermined polar code by adding p information bits to the predetermined polar code at least one time until the polar code of the dimension K is obtained, wherein p≤s and the added p information bits provide an increase in a number of automorphisms of the predetermined polar code.

By so doing, it is also possible to increase the number of automorphisms of the polar code, thereby improving the BLER performance under the automorphism-based polar decoding even more.

According to a second aspect, a decoding apparatus is provided, which comprises a data storage and at least one processor. The data storage comprises processor-executable instructions which, when executed by the at least one processor, cause the at least one processor to operate as follows. At first, the at least one processor receives a codeword from a communication channel. The received codeword comprises a linear combination of information bits of an information word and frozen bits of a polar code. The received codeword is generated by applying the polar code to the information word. The frozen bits are configured to support a predefined set of automorphisms that provides a mapping of the received codeword of the polar code to at least one other codeword of the polar code. The predefined set of automorphisms is based on a binary upper triangular matrix having a diagonal including at least one of zeros and units. Then, the at least one processor obtains a plurality of permuted versions of the received codeword by applying the predefined set of automorphisms to the received codeword. After that, the at least one processor obtains a plurality of candidate codewords by decoding each of the permuted versions of the received codeword and selects a candidate codeword from the obtained plurality of candidate codewords. Due to the frozen bits thus configured, the decoding apparatus may perform automorphism-based polar decoding with respect to the codeword in an efficient manner and with a low decoding latency.

In one embodiment of the second aspect, the at least one processor is configured to select the candidate codeword based on at least one of a maximum-likelihood estimation algorithm and a cyclic redundancy checking algorithm. By so doing, it is possible to select the most suitable candidate codeword from the obtained plurality of candidate codewords.

In one embodiment of the second aspect, the at least one processor is configured to obtain the plurality of candidate codewords by applying SC-based decoding to the plurality of permuted versions of the received codeword. This may allow the decoding apparatus according to the second aspect to be implemented based on the commonly used SC-based decoder.

In one embodiment of the second aspect, the predefined set of automorphisms comprises affine transformations derived from the binary upper triangular matrix. By using the affine transformations based on the binary upper triangular matrix, it is possible to increase the efficiency of the automorphism-based polar decoding of the codeword.

In one embodiment of the second aspect, the predefined set of automorphisms is substantially derived from matrix elements arranged above the diagonal in a vicinity of a bottom right corner of the binary upper triangular matrix. The automorphisms based on these matrix elements may improve BLER performance under the automorphism-based polar decoding.

According to a third aspect, an encoding method is provided. The method starts with the step of receiving an information word comprising information bits. Then, the method proceeds to the step of generating a codeword by applying a polar code to the information word. The codeword comprises a linear combination of the information bits and frozen bits of the polar code. The frozen bits are configured to support a predefined set of automorphisms that provides a mapping of the codeword of the polar code to at least one other codeword of the polar code. The predefined set of automorphisms is based on a binary upper triangular matrix having a diagonal including at least one of zeros and units. After that, the method goes on to the step of transmitting the codeword over a communication channel. Due to the frozen bits thus configured, automorphism-based polar decoding may be subsequently applied to the codeword on the receiving or decoding side in an efficient manner and with a low decoding latency.

In one embodiment of the third aspect, the predefined set of automorphisms is substantially derived from matrix elements arranged above the diagonal in a vicinity of a bottom right corner of the binary upper triangular matrix. The automorphisms based on these matrix elements may improve BLER performance under the subsequent automorphism-based polar decoding.

According to a fourth aspect, a decoding method is provided. The method starts with the step of receiving a codeword from a communication channel. The received codeword comprises a linear combination of information bits of an information word and frozen bits of a polar code. The received codeword is generated by applying the polar code to the information word. The frozen bits are configured to support a predefined set of automorphisms that provides a mapping of the received codeword of the polar code to at least one other codeword of the polar code. The predefined set of automorphisms is based on a binary upper triangular matrix having a diagonal including at least one of zeros and units. Then, the method proceeds to the step of obtaining a plurality of permuted versions of the received codeword by applying the predefined set of automorphisms to the received codeword. After that, the method goes on to the step of obtaining a plurality of candidate codewords by decoding each of the permuted versions of the received codeword. The method further proceeds to the step of selecting a candidate codeword from the obtained plurality of candidate codewords. Due to the frozen bits thus configured, automorphism-based polar decoding may be applied with respect to the codeword in an efficient manner and with a low decoding latency.

In one embodiment of the fourth aspect, the predefined set of automorphisms is substantially derived from matrix elements arranged above the diagonal in a vicinity of a bottom right corner of the binary upper triangular matrix. The automorphisms based on these matrix elements may improve BLER performance under the automorphism-based polar decoding.

According to a fifth aspect, a computer program product is provided. The computer program product comprises a computer-readable storage medium storing a computer code which, when executed by at least one processor, causes the at least one processor to perform the method according to the third aspect. By using such a computer program product, it is possible to simplify the implementation of the method according to the third aspect in any encoding apparatus, like the encoding apparatus according to the first aspect.

According to a sixth aspect, a computer program product is provided. The computer program product comprises a computer-readable storage medium storing a computer code which, when executed by at least one processor, causes the at least one processor to perform the method according to the fourth aspect. By using such a computer program product, it is possible to simplify the implementation of the method according to the fourth aspect in any decoding apparatus, like the decoding apparatus according to the second aspect.

Other features and advantages of the present disclosure will be apparent upon reading the following detailed description and reviewing the accompanying drawings.

BRIEF DESCRIPTION OF THE DRAWINGS

The present disclosure is explained below with reference to the accompanying drawings in which.

DETAILED DESCRIPTION

Figure 1:
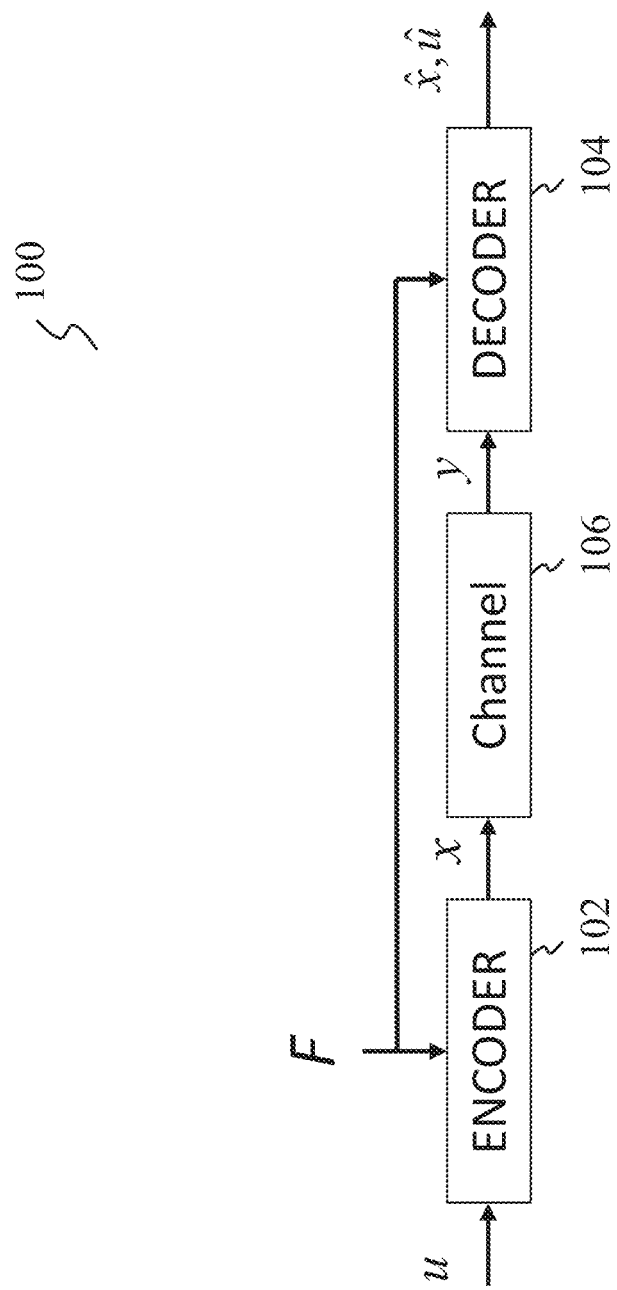
FIG. 1 shows a block diagram of a Forward Error Correction (FEC) coding scheme typically used in a wireless communication system.

Various embodiments of the present disclosure are further described in more detail with reference to the accompanying drawings. However, the present disclosure may be embodied in many other forms and should not be construed as limited to any certain structure or function discussed in the following description. In contrast, these embodiments are provided to make the description of the present disclosure detailed and complete.

According to the detailed description, it will be apparent to the ones skilled in the art that the scope of the present disclosure encompasses any embodiment thereof, which is disclosed herein, irrespective of whether this embodiment is implemented independently or in concert with any other embodiment of the present disclosure. For example, the apparatuses and methods disclosed herein may be implemented in practice by using any numbers of the embodiments provided herein.

The word "exemplary" is used herein in the meaning of "used as an illustration". Unless otherwise stated, any embodiment described herein as "exemplary" should not be construed as preferable or having an advantage over other embodiments.

As used in the embodiments disclosed herein, an encoding apparatus or encoder may refer to an apparatus configured to perform an encoding process based on automorphisms of a polar code. Correspondingly, a decoding apparatus or decoder may refer to an apparatus configured to perform a decoding process based on the automorphisms of the polar code. Such automorphism-based polar encoding and decoding will be discussed later in more detail. It should be noted that each of the encoding apparatus and the decoding apparatus may be integrated into a wireless communication apparatus, such as a user equipment (UE) or a network node, or implemented as an individual apparatus coupled to the wireless communication apparatus via a wireless or wire connection. In the former case, the encoding apparatus and the decoding apparatus may be units of the same wireless communication apparatus, so that this wireless communication apparatus could perform both the automorphism-based polar encoding and decoding.

A UE may refer to a mobile device, a mobile station, a terminal, a subscriber unit, a mobile phone, a cellular phone, a smart phone, a cordless phone, a personal digital assistant (PDA), a wireless communication device, a desktop computer, a laptop computer, a tablet computer, a gaming device, a netbook, a smartbook, an ultrabook, a medical device or medical equipment, a biometric sensor, a wearable device (for example, a smart watch, smart glasses, a smart wrist band, etc.), an entertainment device (for example, an audio player, a video player, etc.), a vehicular component or sensor, a smart meter/sensor, an unmanned vehicle (e.g., an industrial robot, a quadcopter, etc.), industrial manufacturing equipment, a global positioning system (GPS) device, an Internet-of-Things (IoT) device, an Industrial IoT (IIoT) device, a machine-type communication (MTC) device, a group of Massive IoT (MIoT) or Massive MTC (mMTC) devices/sensors, or any other suitable device configured to support wireless communications. In some embodiments, the UE may refer to at least two collocated and interconnected UEs thus defined.

A network node may relate to a fixed point of communication for the UE in a particular wireless communication system. A network node may be implemented as a Radio Access Network (RAN) node referred to as a base transceiver station (BTS) in terms of the 2G communication technology, a NodeB in terms of the 3G communication technology, an evolved NodeB (eNodeB) in terms of the 4G communication technology, and a gNB in terms of the 5G New Radio (NR) communication technology. A RAN node may serve different cells, such as a macrocell, a microcell, a picocell, a femtocell, and/or other types of cells. A macrocell may cover a relatively large geographic area (for example, at least several kilometers in radius). A microcell may cover a geographic area less than two kilometers in radius, for example. A picocell may cover a relatively small geographic area, such, for example, as offices, shopping malls, train stations, stock exchanges, etc. A femtocell may cover an even smaller geographic area (for example, a home). Correspondingly, a RAN node serving the macrocell may be referred to as a macro node, a RAN node serving the microcell may be referred to as a micro node, and so on.

In a wireless communication system, different wireless communication apparatuses (e.g., UEs and/or network nodes) communicate with each other over a wireless communication channel (e.g., a radio channel). Since it is infeasible to make the wireless communication channel noiseless, measures should be taken to deal with errors in data transmission which are resulted from a channel noise. For example, a Forward Error Correction (FEC) coding scheme is commonly used for controlling the errors in the data transmission over such unreliable or noisy wireless communication channels.

FIG. 1 shows a block diagram of a FEC coding scheme 100 typically used in a wireless communication system. The FEC coding scheme 100 is used to protect digital information from a channel noise and interference and reduce a number of bit errors. As shown in FIG. 1, the FEC coding scheme 100 comprises an encoder 102 on the transmitting side and a decoder 104 on the receiving side. The communication between the encoder 102 and the decoder 104 is performed via a noisy wireless communication channel 106. The FEC coding scheme 100 operates as follows. Data u to be transmitted, termed as an information word, are fed to the encoder 102. The encoder 102 applies redundancy, i.e. additional redundant data F, to the data u, thereby generating a codeword x. It should be noted that a set of all possible codewords is called a code or channel code, and the redundant data F are those data or bits which are known both to the encoder 102 and the decoder 104. The encoder 102 then transmits the codeword x over the noisy wireless communication channel 106 which typically introduces the bit errors. Due to the bit errors, the decoder 104 receives not the codeword x itself but its distorted version, termed as an output vector y in FIG. 1. The output vector y may be considered as the combination of the codeword x and the bit errors. By using the output vector y, the decoder 104 obtains estimates of the transmitted codeword x and, subsequently, the transmitted data u. In FIG. 1, these estimates are denoted as x̂ and û, respectively. While obtaining the estimates x̂ and û, the decoder 104 exploits the redundant data F to correct the bit errors.

There are different types of channel codes that can be used in the FEC coding scheme 100, among which polar codes are of particular interest. This is because the polar codes allow one to "redistribute" a probability of bit errors among polarized synthetic bit channels representative of a physical communication channel. Some bit channels have a lower probability of errors than other bit channels. The bit channels having a lower probability of errors, which are also referred to as noiseless bit channels, are then used to transmit information bits. The other bit channels are "frozen" in the sense that they are used merely to transmit frozen bits. Since both the transmitting side and the receiving side know which of the bit channels are frozen, an arbitrary value, such as a binary zero, may be allocated to each of the frozen bit channels. Thus, the polar code allows one to deliver desired information bits by using high-reliability bit channels, thereby minimizing the occurrence of the bit errors. It is worth noting that the polar codes allow for any code rate expressed as R=K/N (where $N=K+F=2^n$ is the length of the polar code, n is the positive integer, K is the number of the information bits, which is also referred to as the information length of code dimension of the polar code, and F is the number of the frozen bits).

By using the polar code of the total length N and the information length K, the codeword x may be generated as follows: x=uT, where $T=T_2^{\otimes n}$ is the transformation matrix of the polar code, $$T_2 = \begin{bmatrix} 1 & 0 \\ 1 & 1 \end{bmatrix}$$

is the kernel matrix of the polar code, ⊗n is the n-fold Kronecker product, and u is the information word. As noted above, the codeword x is received in the form of the output vector y on the receiving side due to the channel noise and any other interference. The output vector y may be decoded based on the SC decoding algorithm, according to which the decoder 104 (which is implemented as a polar decoder in this case) starts with finding a decision for the first bit of the codeword x and feeds this decision back into the decoding process. Then, the decoder 104 finds a decision of the second bit of the codeword x and feeds this decision back into the decoding process. The decoder 104 proceeds in this fashion until it obtains the decision for the last bit of the codeword x. The SCL decoding algorithm is an enhanced version of the SC decoding algorithm, where multiple SC-based decoders operate in parallel and exchange information between each other during the decoding process, while the decision is postponed to the end of the decoding process and is usually performed with the help of a CRC. However, the successive nature of the polar decoders usually used in these decoding algorithms causes their still high decoding latency.

To reduce the decoding latency, it has been proposed to use automorphisms of the polar codes in the decoding process. By definition, an automorphism π of a given code C is such a transformation that maps any codeword x∈C to another (not necessarily different) codeword n(x)∈C. The automorphism may be considered as a permutation of bits in one codeword, which results in obtaining another codeword of the same code. The set of all possible automorphisms of the code C is referred to as an automorphism group Aut(C) of the code C. Automorphism ensemble (AE) decoders, also herein referred to as automorphism-based decoders, have initially been proposed for Reed-Muller (RM) codes. However, given the similarities between the RM codes and the polar codes, it is of great interest to apply the AE decoders to the polar codes for the purpose of reducing their decoding latency.

Figure 2:
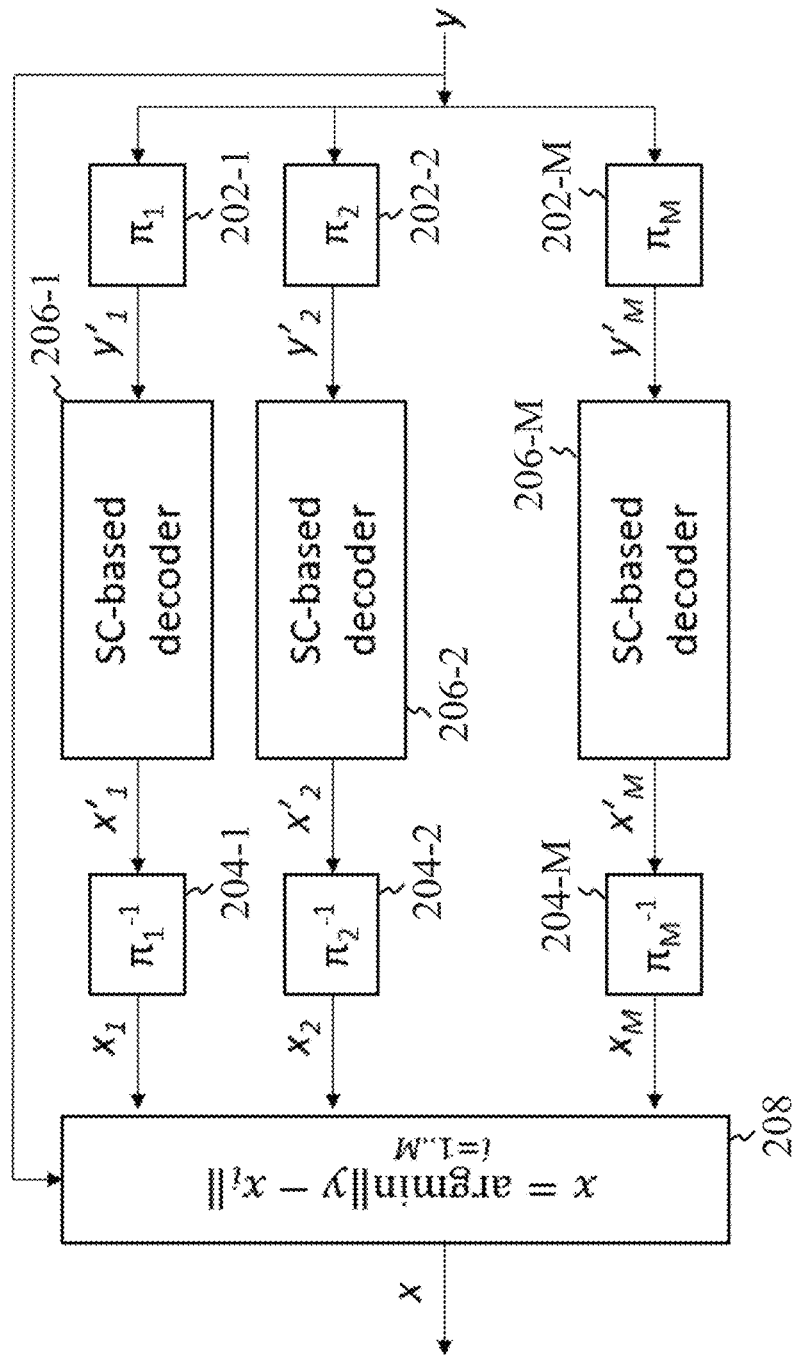
FIG. 2 shows a block diagram of an automorphism ensemble (AE) decoder proposed for Reed-Muller codes.

FIG. 2 shows a block diagram of an AE decoder 200 proposed for the RM codes.

As shown in FIG. 2, the AE decoder 200 comprises interleavers 202-1, 202-2, . . . , 202-M, de-interleavers 204-1, 204-2, . . . , 204-M, SC-based decoders 206-1, 206-2, . . . , 206-M, and a processing unit 208. Each of the interleavers 202-1, 202-2, . . . , 202-M receives an output vector y from a noisy communication channel, the output vector y comprising a codeword x generated by using a RM code. The interleavers 202-1, 202-2, . . . , 202-M obtains M permuted versions of the output vector y by using a set of automorphisms $\pi_1, \pi_2, \ldots, \pi_M$. As noted above, these automorphisms taken from the automorphism group of the RM code provide codeword-to-codeword mapping, while causing no change in the original RM code. It should be also noted that the RM codes have a rich automorphism group, i.e. Aut(RM(n,r))=GA(n), where GA(n) is the (General Affine) affine transformation group and it is described by the group of all the invertible binary matrices of size n×n (plus a vector of size n). Each of the M permuted versions of the output vector y is then fed to corresponding one of the SC-based decoders 206-1, 206-2, . . . , 206-M operating in parallel. The SC-based decoders 206-1, 206-2, . . . , 206-M generate codeword estimates which are also referred to as candidate codewords $x'_1, x'_2, \ldots, x'_M$. The operational principle of the SC-based decoder is well-known in the art, for which reason its detailed description is omitted herein. Next, the candidate codewords $x'_1, x'_2, \ldots, x'_M$ are subjected to inverse automorphisms $\pi_1^{-1}, \pi_2^{-1}, \ldots, \pi_M^{-1}$ in the de-interleavers 204-1, 204-2, . . . , 204-M, resulting in candidate codewords $x_1, x_2, \ldots, x_M$. After that, the processing unit 208 selects one of the candidate codewords $x_1, x_2, \ldots, x_M$ using a predefined metric (typically, a least-squares metric), thereby obtaining a decoder output, i.e. the codeword x.

Referring back to the polar codes, it is known that if a polar code of length $N=2^n$ is designed properly, namely following the so-called channel partial order, then its automorphism group contains a lower triangular affine group of order n, termed as LTA(n), that is described by the group of all binary lower triangular matrices of size n×n (plus a vector of size n). However, it has been shown that permutations in LTA(n) commute with the SC-based decoders, whereupon the result of the SC-based decoding of a codeword permuted using an automorphism from LTA(n) is identical to that obtained by decoding the unpermuted codeword. Therefore, the conventional knowledge of the nature of the automorphism group of polar codes impedes the application of the AE decoders, like the AE decoder 200, to these codes.

Exemplary embodiments of the present disclosure provide for mitigating or even eliminating the above-discussed drawbacks of the prior art. In particular, exemplary embodiments of the present disclosure involve designing the polar codes such that their frozen bits support automorphisms described by a binary upper triangular matrix having a diagonal including at least one of zeros and units. Codewords generated by the polar codes thus designed may be subsequently subjected to automorphism-based polar decoding in an efficient manner and with a lower decoding latency compared to the conventional SCL decoding algorithms. Furthermore, it has been shown that the efficiency of the automorphism-based polar decoding may be increased even more if the automorphisms supported by the frozen bits of the polar codes are based on matrix elements arranged above the diagonal in a vicinity of a bottom right corner of the binary upper triangular matrix.

It should be noted the automorphisms described by the binary upper triangular matrix are rarely present in the automorphism group of the polar codes designed according to the prior art methods, and, even if present, their number is limited or their structure is not helpful to greatly improve the decoding performance of the AE decoders.

Figure 3:
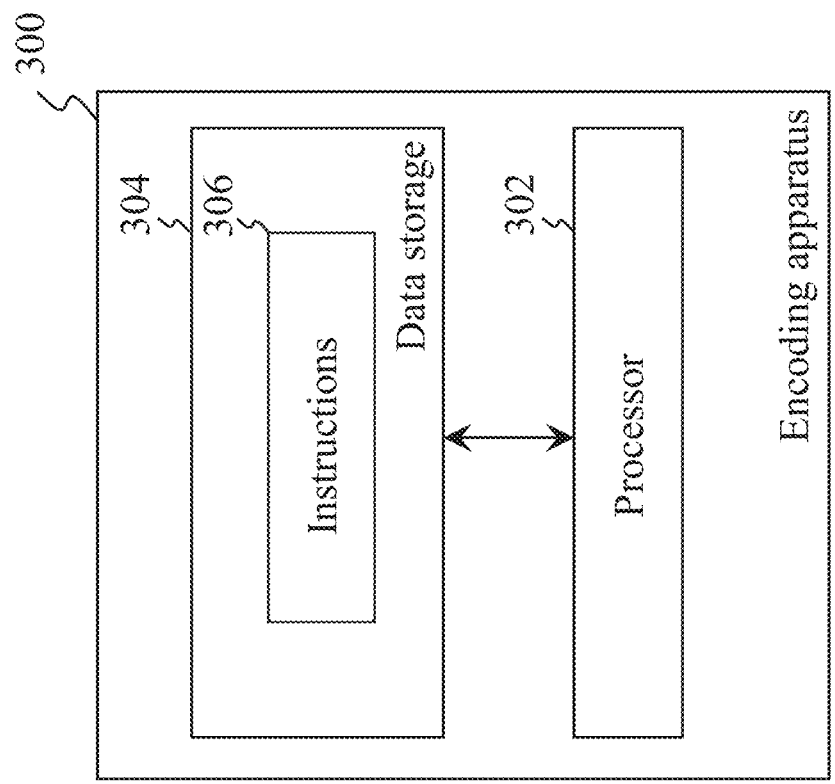
FIG. 3 shows a block diagram of an encoding apparatus in accordance with one exemplary embodiment.

FIG. 3 shows a block diagram of an encoding apparatus 300 in accordance with one exemplary embodiment. As noted earlier, the apparatus 300 may be part of a UE or network node or implemented as an individual apparatus which may be accessed by the UE via a wireless or wired connection. As shown in FIG. 3, the apparatus 300 comprises a processor 302 and a data storage 304. The data storage 304 stores processor-executable instructions 306 which, when executed by the processor 302, cause the processor 302 to perform the automorphism-based polar encoding, as will be described below in more detail. It should be noted that the number, arrangement and interconnection of the constructive elements constituting the apparatus 300, which are shown in FIG. 3, are not intended to be any limitation of the present disclosure, but merely used to provide a general idea of how the constructive elements may be implemented within the apparatus 300. For example, the processor 302 may be replaced with several processors, as well as the data storage 304 may be replaced with several removable and/or fixed storage devices, depending on particular applications. Furthermore, being implemented individually, the apparatus 300 may further comprise a transceiver configured to perform data reception and transmission for different purposes. In some embodiments, such a transceiver may be implemented as two individual devices, with one for a receiving operation and another for a transmitting operation. Irrespective of its implementation, the transceiver is intended to be capable of performing different operations required to perform the data reception and transmission, such, for example, as signal modulation/demodulation, encoding/decoding, etc.

The processor 302 may be implemented as a CPU, general-purpose processor, single-purpose processor, microcontroller, microprocessor, application specific integrated circuit (ASIC), field programmable gate array (FPGA), digital signal processor (DSP), complex programmable logic device, etc. It should be also noted that the processor 302 may be implemented as any combination of one or more of the aforesaid. As an example, the processor 302 may be a combination of two or more microprocessors.

The data storage 304 may be implemented as a classical nonvolatile or volatile memory used in the modern electronic computing machines. As an example, the nonvolatile memory may include Read-Only Memory (ROM), ferroelectric Random-Access Memory (RAM), Programmable ROM (PROM), Electrically Erasable PROM (EEPROM), solid state drive (SSD), flash memory, magnetic disk storage (such as hard drives and magnetic tapes), optical disc storage (such as CD, DVD and Blu-ray discs), etc. As for the volatile memory, examples thereof include Dynamic RAM, Synchronous DRAM (SDRAM), Double Data Rate SDRAM (DDR SDRAM), Static RAM, etc.

The processor-executable instructions 306 stored in the data storage 304 may be configured as a computer-executable code which causes the processor 302 to perform the aspects of the present disclosure. The computer-executable code for carrying out operations or steps for the aspects of the present disclosure may be written in any combination of one or more programming languages, such as Java, C++, or the like. In some examples, the computer-executable code may be in the form of a high-level language or in a pre-compiled form and be generated by an interpreter (also pre-stored in the data storage 304) on the fly.

Figure 4:
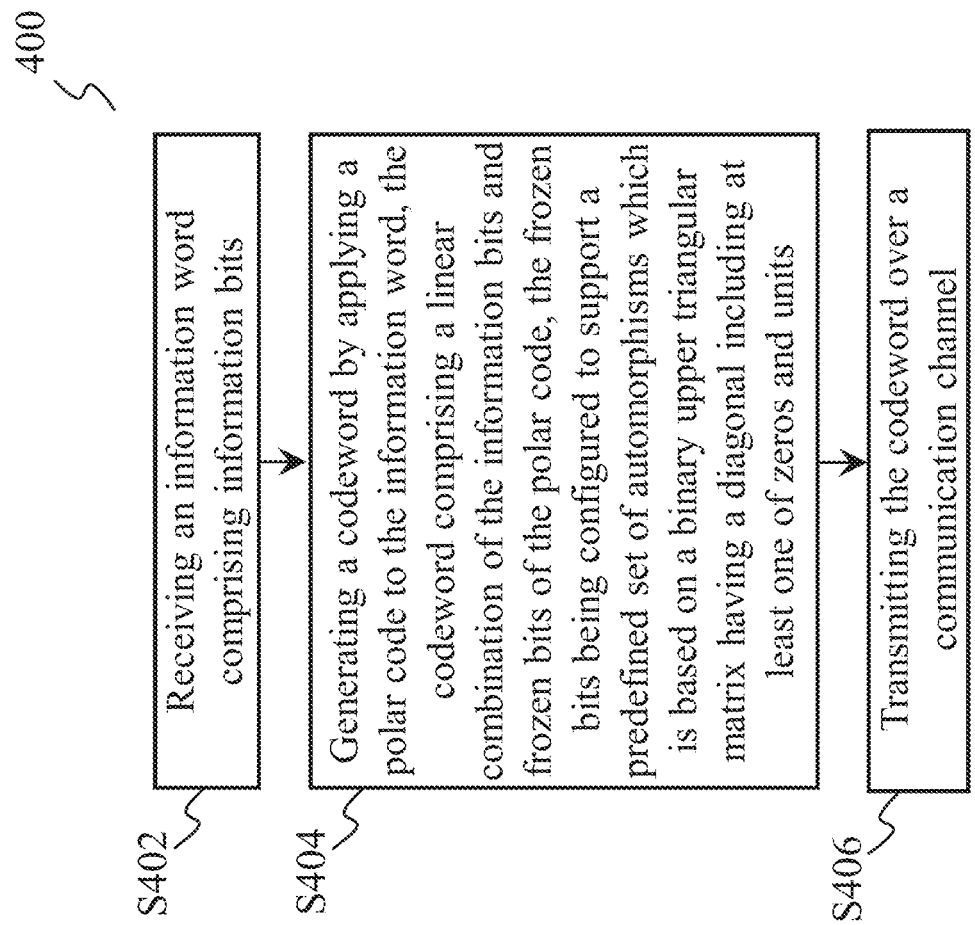
FIG. 4 shows a flowchart of an encoding method in accordance with one exemplary embodiment.

FIG. 4 shows a flowchart of an encoding method 400 in accordance with one exemplary embodiment. In general, the method 400 describes the operation of the apparatus 300. The method 400 starts with a step S402, in which the processor 302 receives an information word comprising information bits. Then, the method 400 proceeds to a step S404, in which the processor 302 generates a codeword by applying a polar code to the information word. The codeword comprises a linear combination of the information bits and frozen bits of the polar code. The frozen bits are configured to support a predefined set of automorphisms that provides a mapping of the codeword of the polar code to at least one other codeword of the polar code. Said at least one other codeword may be the same as the codeword generated in the step S404 of the method 400. For example, this is the case when the codeword generated in the step S404 of the method 400 is an all-zero codeword. The predefined set of automorphisms used in the method 400 is based on a binary upper triangular matrix having a diagonal including at least one of zeros and units. After that, the method 400 goes on to a step S406, in which the processor 302 causes the codeword to be transmitted over a communication channel. Due to the frozen bits thus configured, the automorphism-based polar decoding of the codeword may be subsequently performed on the receiving or decoding side in an efficient manner and with a low decoding latency.

In one embodiment, the predefined set of automorphisms supported by the frozen bits of the polar code may comprise affine transformations derived from the binary upper triangular matrix. Given that the affine transformations are invertible, the original codeword of the polar code, which is generated in the step S404 of the method 400, may be mapped by using some affine transformation to another codeword of the same polar code, and the reverse is also possible, i.e. said another codeword may be mapped by using the same affine transformation to the original codeword. The affine transformations based on the binary upper triangular matrix may increase the efficiency of the subsequent automorphism-based decoding of the codeword. However, the affine transformations should not be construed as any limitation of the present disclosure; it is enough that the automorphisms supported by the frozen bits of the polar code provide the mapping of the original codeword to any other (not necessarily different) codeword of the same polar code.

In a preferred embodiment, the predefined set of automorphisms supported by the frozen bits of the polar code may be substantially derived from matrix elements arranged above the diagonal in a vicinity of a bottom right corner of the binary upper triangular matrix. It has been found that the automorphisms based on these matrix elements may improve BLER performance under the subsequent automorphism-based decoding.

Figure 5:
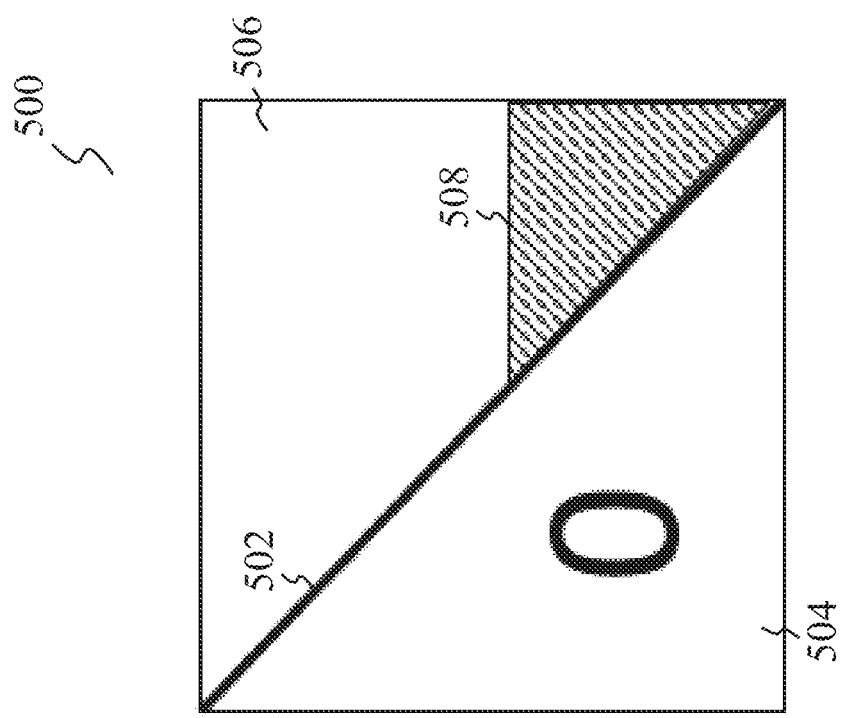
FIG. 5 shows a schematic view of a binary upper triangular matrix used in the method shown in FIG. 4.

FIG. 5 shows a schematic view of a binary upper triangular matrix 500 which may be used in the method 400. As shown in FIG. 5, the matrix 500 is divided by a main diagonal 502 into a lower matrix part 504 and an upper matrix part 506. The matrix 500 is called "upper triangular" because all the matrix elements arranged in the lower matrix part 504 are zero. FIG. 5 also shows a subpart 508 of the upper matrix part 506, the element of which may be used for the automorphisms in accordance with the preferred embodiment.

To provide better decoding performance (e.g., better BLER performance), the number of the automorphisms of the polar code is increased. To explain how an increase in the number of the automorphisms of the polar code may be achieved, the polar codes will be first described through monomials.

Monomial codes are a family of codes of length $N=2^n$ that can be obtained as evaluations of Boolean functions, namely as polynomials in the Galois field of two elements, i.e. $\mathbb{F}_2[x_0, \ldots, x_{n-1}]$. A monomial code of length $N=2^n$ and code dimension K is generated by picking K monomials out of N possible independent monomials to generate a code space. The K chosen monomials are called generating monomials and form a generating monomial set $\mathcal{M}$; the evaluation of their linear combinations provides a codebook of the monomial code. The monomial code is considered decreasing if, for every monomial in a set of generating monomial, all its monomial factors belong to the same set. Both the RM and polar codes may be described through this formalism. In fact, the rows of the transformation matrix of the polar code represent all possible evaluations of the monomials over $\mathbb{F}_2$. In particular, the polar codes are defined by picking the monomials according to the channel polarization phenomenon; if the polar code design is compliant with the universal partial order framework, the resulting code is a decreasing monomial code.

As noted earlier, the nature of the automorphism group of the polar codes is generally unknown, but their decreasing monomial code description allows one to find a subgroup of its automorphism group. In fact, the automorphism group of the RM codes of length $N=2^n$ is an affine group of order n, i.e. GA(n), that is defined as the group of all transformations of n variables described by the transformation $x'=Ax+b$, where A is the n×n invertible binary matrix and b is the binary column vector of length n. The automorphism group of decreasing monomial codes is unknown, but one of its subgroups is known; in fact, the group of lower-triangular affine transformations of order n, i.e. LTA(n), contained in GA(n), is a subgroup of the automorphism group of a decreasing monomial code. This group may be defined similarly to GA(n), where, in this case, the matrix A is a lower triangular matrix having a full diagonal. Since the well-designed polar codes are also decreasing monomial codes, then LTA(n) is a subgroup of the automorphism group of the polar codes.

In order to better evaluate the automorphism group of the polar code, the following remark may be used: an affine transformation belongs to the automorphism group of the monomial code if it maps every generating monomial to a linear combination of generating monomials. This remark may be used to search for the automorphisms which do not belong to LTA(n). In practice, if A is an n×n transformation matrix defining an affine transformation, then A belongs to the automorphism group of the monomial code generated by a monomial set $\mathcal{M}$ only if, for every non-zero matrix element $A_{i,j}=1$, a monomial $x_j$ may substitute $x_i$ in $\mathcal{M}$ and provide a set of monomials $\mathcal{M}'$ contained in $\mathcal{M}$.

As an example, consider a (N=16, K=7) polar code generated by a monomial set $\mathcal{M} = \{1, x_0, x_1, x_2, x_3, x_0, x_1, x_0, x_2\}$, namely having an information set I={7,10,11,12,13,14,15}. By substituting the monomial $x_1$ with the monomial $x_2$ in the set $\mathcal{M}$, one can obtain the set of monomials $\mathcal{M}'=\{1, x_0, x_2, x_0, x_2, x_3\} \subseteq \mathcal{M}$; as a consequence, the affine transformation defined by the matrix A having an entry $A_{1,2}=1$ may belong to the automorphism group of the polar code. On the contrary, by substituting the monomial $x_0$ with the monomial $x_1$ in the set $\mathcal{M}$, one can obtain the set of monomials $\mathcal{M}'=\{1, x_1, x_2, x_1x_2, x_3\} \not\subseteq \mathcal{M}$; in this case, the affine transformation defined by the matrix A having an entry $A_{0,1}=1$ cannot belong to the automorphism group of the polar code. Proceeding in this way for all the entries of the matrix A, one can obtain that all invertible binary matrices in the form $$A = \begin{bmatrix} * & 0 & 0 & 0 \\ * & * & * & 0 \\ * & * & * & 0 \\ * & * & * & * \end{bmatrix}, b = \begin{bmatrix} * \\ * \\ * \\ * \end{bmatrix},$$

with $* \in \{0,1\}$, belong to the automorphism group of the (16,7) polar code. It is worth noting that this group is larger than LTA(n), even if it may not include all the elements of the automorphism group of the polar code.

Given the LTA absorption property of the SC-based decoders, under AE decoding it is convenient to focus on upper triangular linear transformations, i.e. UTL(n), which represent transformations described by $x'=Ux$, where U is the binary upper triangular matrix. Here the linear transformations are used instead of the affine transformations because the introduction of an affine transformation vector b does not change the result of the decoding under the SC-based decoders. As an example, an UTL(n) transformation for the (16,7) polar code described previously has the form $$U = \begin{bmatrix} 1 & 0 & 0 & 0 \\ 0 & 1 & * & 0 \\ 0 & 0 & 1 & 0 \\ 0 & 0 & 0 & 1 \end{bmatrix},$$

with $* \in \{0,1\}$; as a consequence, the automorphism group of the polar code admits only one non-trivial UTL(4) transformation.

Figure 6:
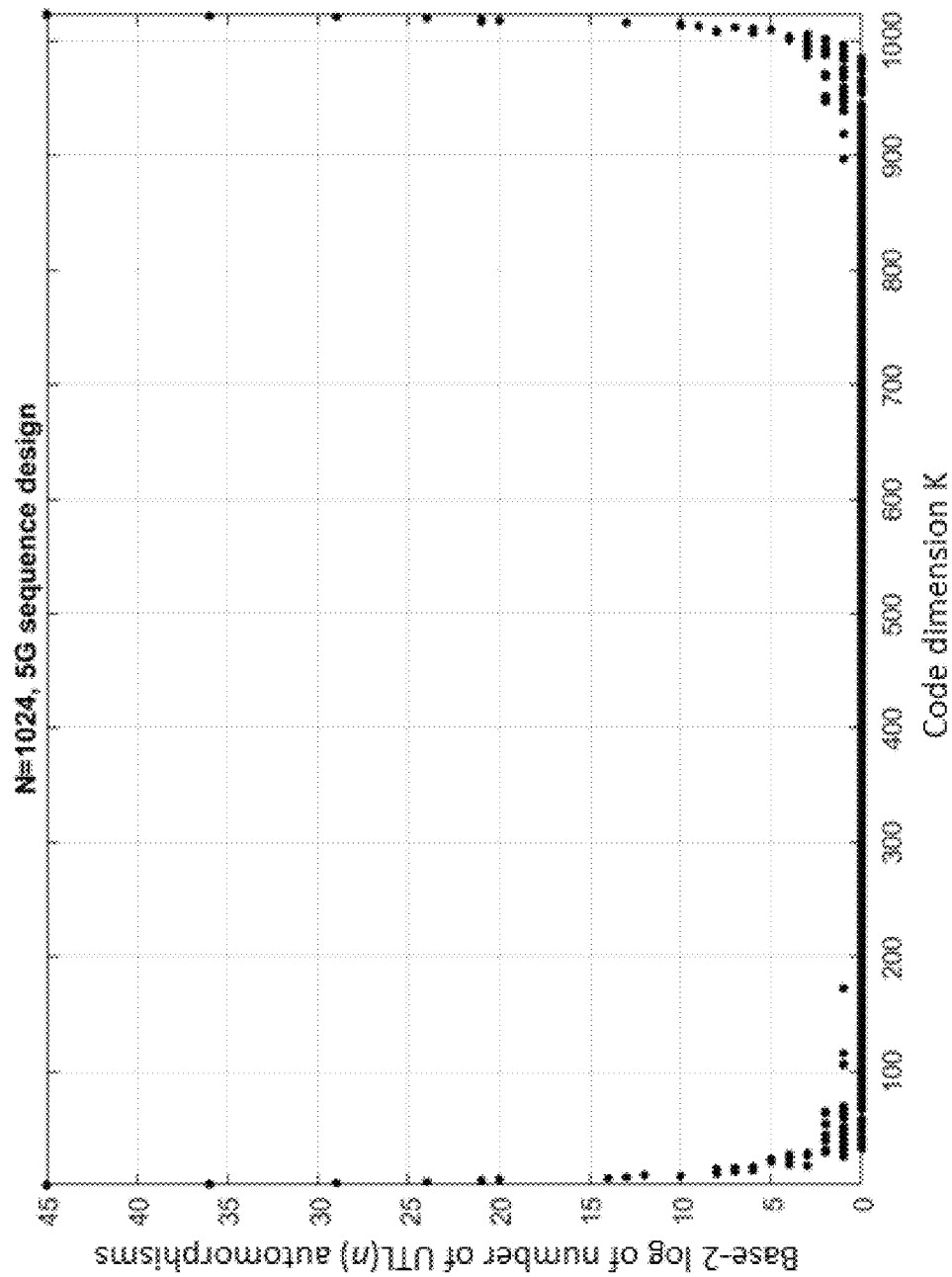
FIG. 6 shows a base-2 log number of automorphisms UTL(n) as a function of a code dimension K for polar codes of length N=1024 which are designed according to the reliability sequence standardized for 5G polar codes.

According to the embodiments disclosed herein, the frozen set of the polar codes are configured such that the automorphism group of the resulting polar code include UTL(n) automorphisms defined by the binary upper triangular matrix. In fact, the number of the polar codes designed by using the reliability sequence standardized for 5G polar codes and admitting such UTL(n) automorphisms decreases with the code length, i.e. the longer the polar code, the smaller is the probability that it admits any of the UTL(n) automorphism. As an example of this phenomenon, FIG. 6 shows the base-2 logarithm of the number of UTL(n) automorphisms as a function of the code dimension K for the polar codes of length N=1024 designed according to the reliability sequence standardized for the 5G polar codes. As can be seen, the number of the UTL(n) automorphisms is quite limited and usually insufficient to improve the BLER performance under the AE decoding.

Given a reliability sequence R (e.g., the reliability sequence standardized for the 5G polar codes) of the N polarized synthetic bit channels, it is possible to create a (N,K) polar code C for any given dimension K. If the resulting polar code does not admit enough UTL(n) automorphisms, the following approach may be used to reconfigure its information or frozen bits in order to increase their number.

More specifically, the method 400 may comprise, before the step S404, a further step, in which the processor 302 first receives a (N, K-s) polar code $C_s$ designed according to the reliability sequence R and having frozen bits $F_s$, with s<K. The polar code $C_s$ may be the one used by the processor 302 in the past and/or anyhow available to the processor 302. For example, the polar code $C_s$ may be stored in a memory of the UE which includes the encoding apparatus 300, and the processor 302 accesses the memory to retrieve the polar code $C_s$. The polar code $C_s$ also comprises a generating monomial set $\mathcal{M}_s$. The generating monomial set $\mathcal{M}_s$ is then inspected by the processor 302 to look for the monomials that should be added to make available each matrix element of the binary upper triangular matrix A. Next, based on the matrix element that has been selected, the processor 302 adds p monomials to the generating monomial set, obtaining a (N, K-s') polar code $C_{s'}$ having a frozen set $F_{s'}$ and a generating monomial set $\mathcal{M}_{s'}$, with s'=s−p. This procedure may be repeated by the processor 302 until the desired code dimension K is reached, i.e. until s'=0. The above-described addition of the monomials is equivalent to the addition of information or frozen bits to the polar code $C_s$, as should be apparent to those skilled in the art. By designing the polar code in this manner, it is possible to provide an increase in the number of its automorphisms. The above-described approach is not the only way to increase the number of the UTL(n) automorphisms, but it provides evidence that it is technically possible to increase the number of the UTL(n) automorphisms of any given polar code.

Now consider some non-limitative numerical examples of how to apply the above-described approach to the (16,7) polar code used earlier. This polar code is generated by the monomial set $\mathcal{M} = \{1, x_0, x_1, x_2, x_3, x_0, x_1, x_0, x_2\}$ and has the information set I={7,10,11,12,13,14,15}. As is shown above, the UTL(4) subgroup of its automorphism group includes only one non-trivial element, hence the AE decoder, like the decoder 200, may be applied only with a list of size $\mathcal{M}$=2. If s=1 and applying the above-described approach, the processor 302 should use, as the code $C_s$, a (16,6) polar code generated by a monomial set $\mathcal{M}_1 = \{1, x_0, x_1, x_2, x_3, x_0, x_1\}$ and having an information set $I_1$={7,11,12,13,14,15}. Analyzing $\mathcal{M}_1$, one can see that, in order to increase the number of the automorphisms UTL(4) in the resulting polar code of the code dimension K, there are only three possibilities:

1. If a monomial $x_2 x_3$ is added to $\mathcal{M}_1$, the resulting monomial set $\mathcal{M}' = \{1, x_0, x_1, x_2, x_3, x_0, x_1, x_2 x_3\}$ generates a (16,7) polar code having an information set I'={3,7,11,12,13,14,15}. This polar code admits the UTL(4) automorphisms in the form $$U = \begin{bmatrix} 1 & * & 0 & 0 \\ 0 & 1 & 0 & 0 \\ 0 & 0 & 1 & * \\ 0 & 0 & 0 & 1 \end{bmatrix},$$

with *∈{0,1}; as a consequence, the automorphism group of the polar code admits $2^2$ UTL(4) automorphisms.

2. If a monomial $x_1 x_2$ is added to $\mathcal{M}_1$, the resulting monomial set $\mathcal{M}' = \{1, x_0, x_1, x_2, x_3, x_0, x_1, x_1 x_2\}$ generates a (16,7) polar code having an information set I'={7,9,11,12,13,14,15}. This polar code admits the UTL(4) automorphisms in the form $$U = \begin{bmatrix} 1 & * & * & 0 \\ 0 & 1 & 0 & 0 \\ 0 & 0 & 1 & 0 \\ 0 & 0 & 0 & 1 \end{bmatrix},$$

with *∈{0,1}; as a consequence, the automorphism group of the polar code admits $2^2$ UTL(4) automorphisms.

3. If a monomial $x_1 x_3$ is added to $\mathcal{M}_1$, the resulting monomial set $\mathcal{M}' = \{1, x_0, x_1, x_2, x_3, x_0, x_1, x_1 x_3\}$ generates a (16,7) polar code having an information set I'={5,7,11,12,13,14,15}. This polar code admits the UTL(4) automorphisms in the form $$U = \begin{bmatrix} 1 & * & 0 & * \\ 0 & 1 & 0 & 0 \\ 0 & 0 & 1 & * \\ 0 & 0 & 0 & 1 \end{bmatrix},$$

with *∈{0,1}; as a consequence, the automorphism group of the polar code admits $2^3$ UTL(4) automorphisms.

Thus, the above-described approach allows one to increase the number of the UTL(4) automorphisms of the original polar code. Moreover, by setting s=2, the number of possibilities is further incremented. In this case, the processor 302 should start from a (16,5) polar code generated by a monomial set $\mathcal{M}_2 = \{1, x_0, x_1, x_2, x_3\}$ and having an information set $I_2$={7,11,13,14,15}. Analyzing $\mathcal{M}_2$, one can see that, in order to increase the number of the UTL(4) automorphisms in the resulting polar code of the code dimension K, there are multiple possibilities given the good starting point of the whole process. In the following, only four out of the many possible results are described:

1. If monomials $x_0, x_2$ and $x_0, x_3$ are added to $\mathcal{M}_2$, the resulting monomial set $\mathcal{M}' = \{1, x_0, x_1, x_2, x_3, x_0 x_2, x_0, x_3\}$ generates a (16,7) polar code having an information set I'={6,7,10,11,13,14,15}. This polar code admits the UTL(4) automorphisms in the form $$U = \begin{bmatrix} 1 & 0 & 0 & 0 \\ 0 & 1 & * & * \\ 0 & 0 & 1 & * \\ 0 & 0 & 0 & 1 \end{bmatrix},$$

with $* \in \{0,1\}$; as a consequence, the automorphism group of the polar code admits $2^3$ UTL(4) automorphisms.

2. If monomials $x_0$, $x_2$ and $x_2x_3$ are added to $\mathcal{M}_2$, the resulting monomial set $\mathcal{M}'=\{1, x_0, x_1, x_2, x_3, x_0x_2, x_2x_3\}$ generates a (16,7) polar code having an information set I'=\{3,7,10,11,13,14,15\}. This polar code admits the UTL(4) automorphisms in the form $$U = \begin{bmatrix} 1 & 0 & * & * \\ 0 & 1 & * & * \\ 0 & 0 & 1 & 0 \\ 0 & 0 & 0 & 1 \end{bmatrix},$$

with $* \in \{0,1\}$; as a consequence, the automorphism group of the polar code admits $2^4$ UTL(4) automorphisms.

3. If monomials $x_1x_2$ and $x_2x_3$ are added to $\mathcal{M}_2$, the resulting monomial set $\mathcal{M}'=\{1, x_0, x_1, x_2, x_3, x_1x_2, x_2x_3\}$ generates a (16,7) polar code having an information set I'=\{3,7,9,11,13,14,15\}. This polar code admits the UTL(4 automorphisms in the form $$U = \begin{bmatrix} 1 & * & * & * \\ 0 & 1 & * & * \\ 0 & 0 & 1 & 0 \\ 0 & 0 & 0 & 1 \end{bmatrix},$$

with $* \in \{0,1\}$; as a consequence, the automorphism group of the polar code admits $2^5$ UTL(4) automorphisms.

4. If monomials $x_1x_3$ and $x_2x_3$ are added to $\mathcal{M}_2$, the resulting monomial set $\mathcal{M}'=\{1, x_0, x_1, x_2, x_3, x_1x_3, x_2x_3\}$ generates a (16,7) polar code having an information set I'=\{3,5,7,11,13,14,15\}. This polar code admits the UTL(4) automorphisms in the form $$U = \begin{bmatrix} 1 & * & * & * \\ 0 & 1 & * & * \\ 0 & 0 & 1 & * \\ 0 & 0 & 0 & 1 \end{bmatrix},$$

with $* \in \{0,1\}$; as a consequence, the automorphism group of the code admits $2^6$ UTL(4) automorphisms.

The above examples prove that the above-described approach is effective to design the polar codes having a larger number of UTL(n) automorphisms than the state-of-the-art methods.

Figure 7:
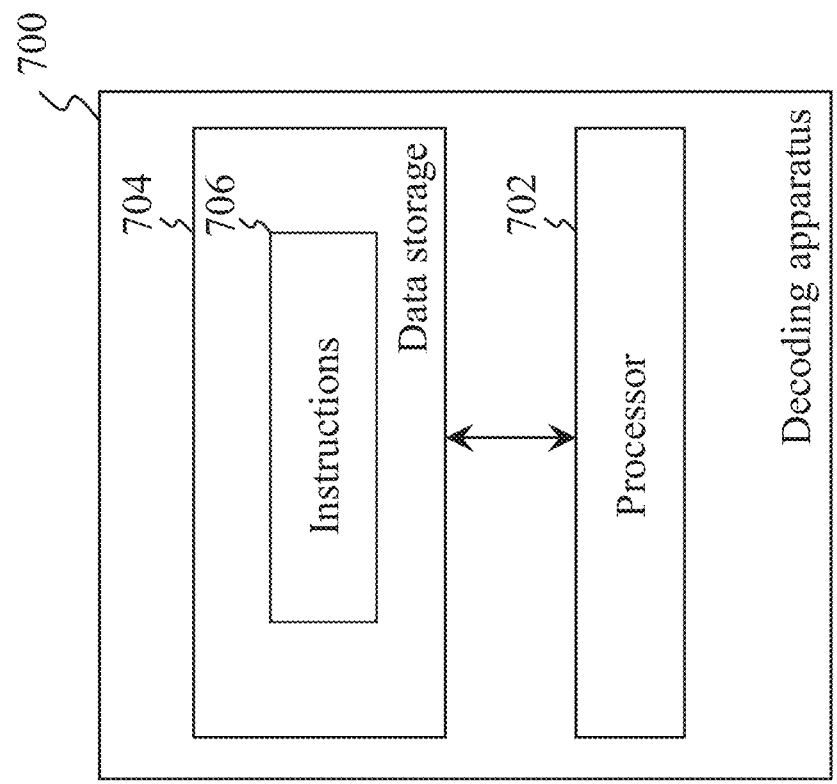
FIG. 7 shows a block diagram of a decoding apparatus in accordance with one exemplary embodiment.

FIG. 7 shows a block diagram of a decoding apparatus 700 in accordance with one exemplary embodiment. Similar to the apparatus 300, the apparatus 400 may be part of a UE or network node or implemented as an individual apparatus which may be accessed by the UE via a wireless or wired connection. On top of that, the apparatuses 300 and 400 may be part of the same UE or network node, if required. As shown in FIG. 7, the apparatus 700 comprises a processor 702 and a data storage 704. The data storage 704 stores processor-executable instructions 706 which, when executed by the processor 702, cause the processor 702 to perform the automorphism-based polar decoding, as will be described below in more detail. It should be again noted that the number, arrangement and interconnection of the constructive elements constituting the apparatus 700, which are shown in FIG. 7, are not intended to be any limitation of the present disclosure, but merely used to provide a general idea of how the constructive elements may be implemented within the apparatus 700. For example, the processor 702 may be replaced with several processors, as well as the data storage 704 may be replaced with several removable and/or fixed storage devices, depending on particular applications. Furthermore, being implemented individually, the apparatus 700 may further comprise a transceiver configured to perform data reception and transmission for different purposes. In some embodiments, such a transceiver may be implemented as two individual devices, with one for a receiving operation and another for a transmitting operation. Irrespective of its implementation, the transceiver is intended to be capable of performing different operations required to perform the data reception and transmission, such, for example, as signal modulation/demodulation, encoding/decoding, etc.

As for the processor 702, the data storage 704 and the processor-executable instructions 706, they may be implemented in the same or similar manner as the processor 302, the data storage 304 and the processor-executable instructions 306, respectively, of the encoding apparatus 300.

Figure 8:
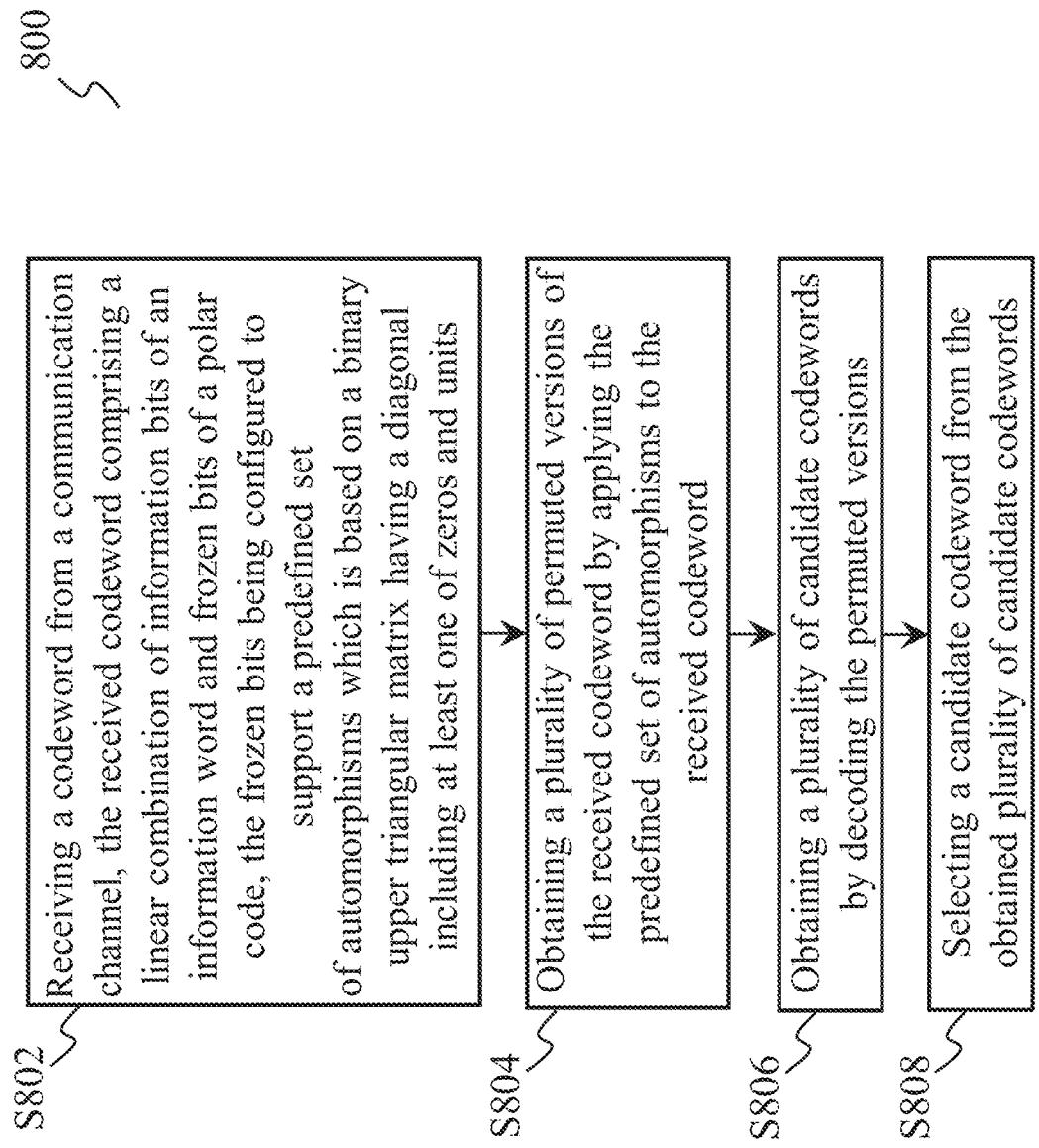
FIG. 8 shows a flowchart of a decoding method in accordance with one exemplary embodiment.

FIG. 8 shows a flowchart of a decoding method 800 in accordance with one exemplary embodiment. In general, the method 800 describes the operation of the apparatus 700. The method 800 starts with a step S802, in which the processor 702 receives a codeword from a communication channel. This codeword is a distorted (due to the channel noise and other possible interference) version of the codeword generated and transmitted by the apparatus 300. As noted earlier, the frozen bits of the polar code used to generate the codeword are configured to support the predefined set of automorphisms of the polar code, which is based on the binary upper triangular matrix. The binary upper triangular matrix may be implemented as the matrix 500, for example. Here it is necessary to note that, in order to properly perform the automorphism-based polar decoding, the processor 702 should be aware of the automorphisms supported by the frozen bits of the polar code. For this reason, in one embodiment, the processors 302 and 702 may be both pre-configured to use the same set of automorphisms. In another embodiment, the apparatus 300 may send information about the required automorphisms to the apparatus 700, for example, together with the codeword or before sending the codeword. Once the codeword is received, the method 800 proceeds to a next step S804, in which the processor 702 obtains a plurality of permuted versions of the received codeword by applying the predefined set of automorphisms to the received codeword. After that, the method 800 goes on to a step S806, in which the processor 702 obtains a plurality of candidate codewords by decoding each of the permuted versions of the received codeword. The method further proceeds to a step S808, in which the processor 702 selects a candidate codeword from the obtained plurality of candidate codewords. Due to the frozen bits thus configured, the automorphism-based polar decoding may be applied with respect to the codeword in an efficient manner and with a low decoding latency.

In one embodiment, the step S808 of the method 800 may be performed by the processor 702 based on at least one of a maximum-likelihood estimation algorithm and a cyclic redundancy checking algorithm. By so doing, it is possible to select the most suitable candidate codeword from the obtained plurality of candidate codewords.

In one embodiment, the processor 702 may perform the step S806 of the method 800 by applying SC-based decoding to the plurality of permuted versions of the received codeword. This may allow the decoding apparatus 700 to be implemented based on the commonly used SC-based decoder, thereby simplifying its manufacture. In particular, this may allow the apparatus 700 to be implemented as the AE decoder 200.

To show that the UTL automorphisms may improve the decoding performance, especially the BLER performance, for the polar codes, the results of the method 800 were compared to those obtained by using the prior art SC, SCL, and AE-SC decoding methods. The comparison of these results is shown in FIG. 9.

Figure 9:
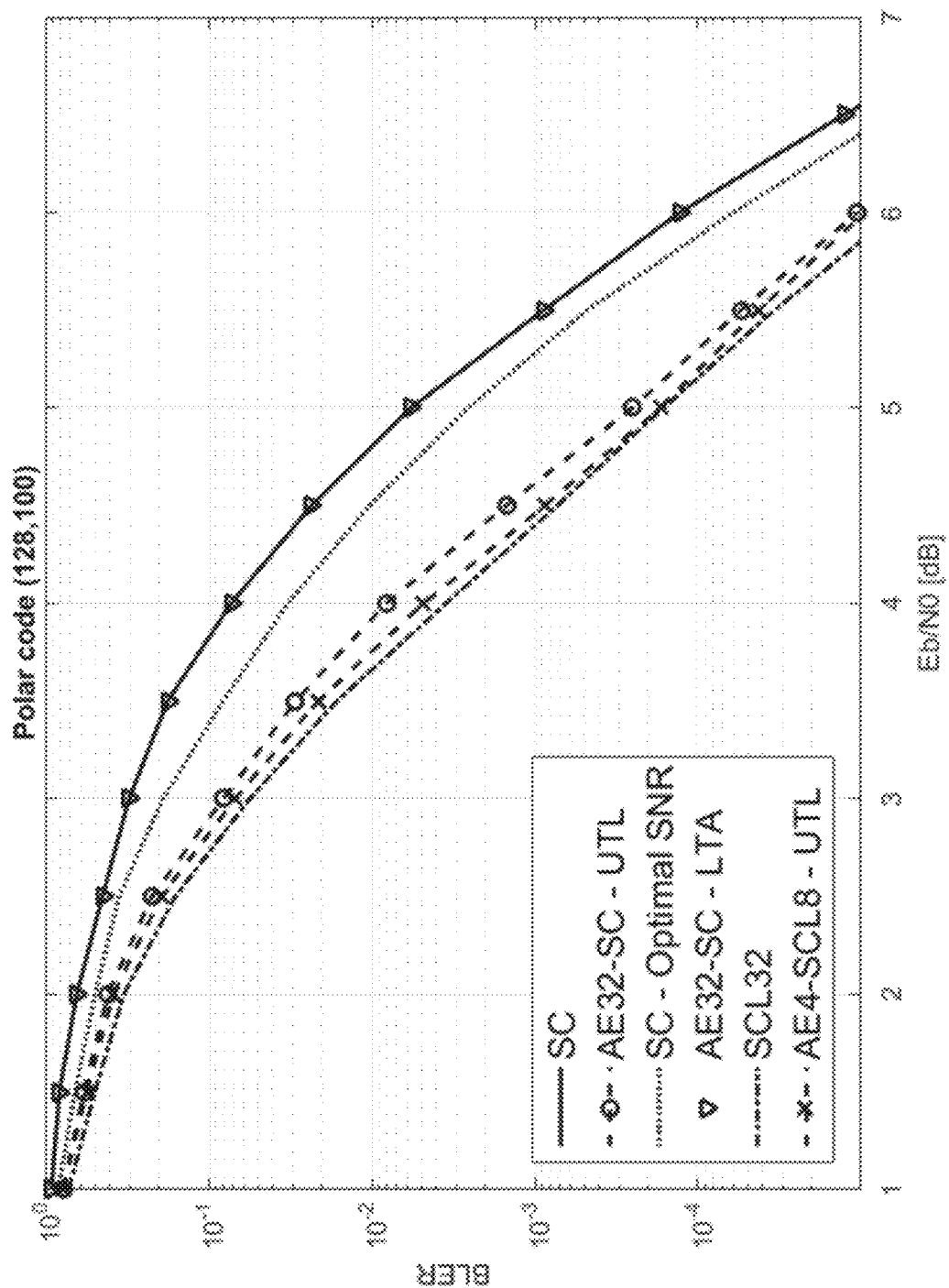
FIG. 9 shows dependences of a Block Error Rate (BLER) on a Signal-to-Noise Ratio (SNR), which are obtained using the method shown in FIG. 8 and the prior art SC, SCL, and AE-SC decoding methods for a (128,100) polar code.

More specifically, FIG. 9 shows dependences of BLER (SNR) obtained using the method 800 and the prior art SC, SCL, and AE-SC decoding methods for a (128,100) polar code. It should be noted that, in this case, the signal-to-noise ratio (SNR) is expressed as Eb/N0, which is a ratio of energy per bit to a noise power spectral density. The curves denoted as "SC" and "SCL32" are obtained by the SC and SCL decoding methods, respectively (where "SCL32" means an SCL-based decoder with a list size L=32). The curve denoted as "AE32-SC" is obtained by using the prior art AE-SC decoding method with a list of M=32 LTA automorphisms, and it perfectly matches the SC curve, thereby confirming the uselessness of the LTA automorphisms under the AE decoding. FIG. 9 also shows the BLER performance of a polar code designed using an optimal SNR for each simulation point: this curve should be considered a benchmark on the best possible BLER performance of any (128, 100) polar code decoded using the SC decoding. The rest two curves denoted as "AE32-SC" and "AE4-SCL8" represent the results of the AE decoding based on the UTL automorphisms, i.e. by using the method 800. The curve "AE32-SC" is obtained by using a list of M=32 UTL automorphisms in the AE decoder, where each independent decoder implements the conventional SC decoding. The curve "AE4-SCL8" is obtained by using a list of M=4 UTL automorphisms in the AE decoder, where each independent decoder implements a SCL8-based decoder (i.e. the SCL-based decoder with a list size L=8). As can be seen, the AE decoding based on the UTL automorphisms outperforms the prior art decoding methods, and even beats the best performance achievable by applying the SC decoding to the polar code. It is worth noting that the above-described approach to increasing the number of the UTL automorphisms of the polar code was not applied in this case.

Figure 10:
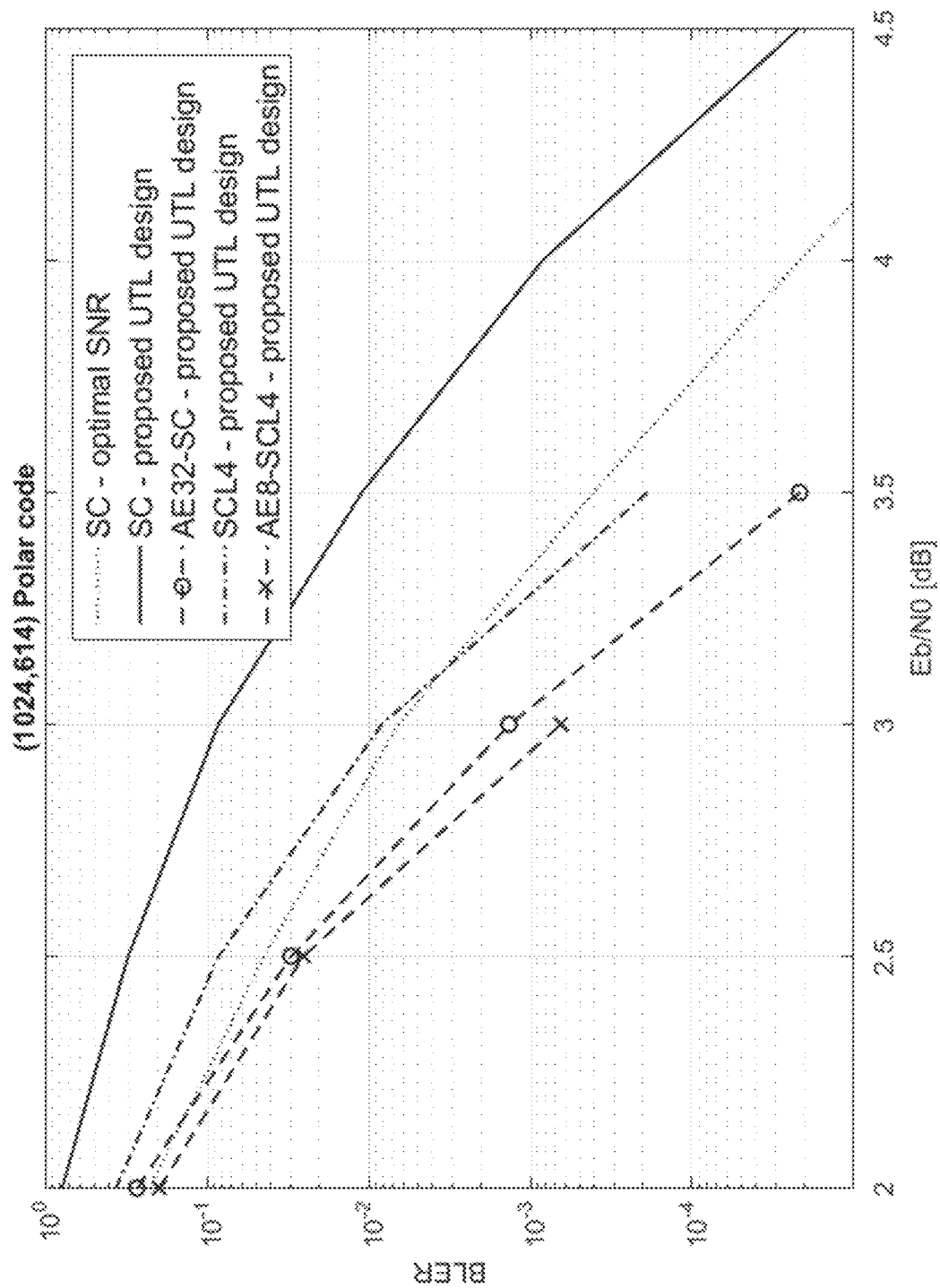
FIG. 10 shows dependences of BLER(SNR) obtained for a (1024,614) polar code using the method shown in FIG. 8 together with an approach to increasing the number of ULT(n) automorphisms according to the present disclosure.

FIG. 10 shows dependences of BLER(SNR) obtained for a (1024,614) polar code using the method 800 together with an approach to increasing the number of ULT(n) automorphisms according to the present disclosure. In particular, FIG. 10 shows the BLER performance under the SC and SCL4 decoding applied to the polar code; as before the performance of optimal SNR designed polar codes under SC is depicted as a benchmark. One can see that this approach allows running the AE decoding with the list of M=32 UTL automorphisms, which outperforms the SC decoding of any polar code of the same parameters. Moreover, the BLER performances shown in FIG. 10 may be improved by using SCL4-based decoders instead of the SC-based decoders inside the AE decoder.

It should be noted that each step or operation of the methods 400 or 800, or any combinations of the steps or operations, can be implemented by various means, such as hardware, firmware, and/or software. As an example, one or more of the steps or operations described above can be embodied by processor executable instructions, data structures, program modules, and other suitable data representations. Furthermore, the executable instructions which embody the steps or operations described above can be stored on a corresponding data carrier and executed by the processor 302 and the processor 702, respectively. This data carrier can be implemented as any computer-readable storage medium configured to be readable by the processor 302 and the processor 702 to execute the processor executable instructions. Such computer-readable storage media can include both volatile and nonvolatile media, removable and non-removable media. By way of example, and not limitation, the computer-readable media comprise media implemented in any method or technology suitable for storing information. In more detail, the practical examples of the computer-readable media include, but are not limited to information-delivery media, RAM, ROM, EEPROM, flash memory or other memory technology, CD-ROM, digital versatile discs (DVD), holographic media or other optical disc storage, magnetic tape, magnetic cassettes, magnetic disk storage, and other magnetic storage devices.

Although the exemplary embodiments of the present disclosure are described herein, it should be noted that various changes and modifications could be made to the described embodiments of the present disclosure without departing from the scope of legal protection which is defined by the appended claims. In the appended claims, the word "comprising" does not exclude other elements or operations, and the indefinite article "a" or "an" does not exclude a plurality. The mere fact that certain measures are recited in mutually different dependent claims does not indicate that a combination of these measures cannot be used to advantage.

What is claimed is:

1. An encoding apparatus, comprising:
   a data storage comprising processor-executable instructions; and
   at least one processor coupled to the data storage and configured, based on executing the processor-executable instructions, to facilitate the following being performed by the encoding apparatus:
   receiving an information word comprising information bits;
   generating a codeword by applying a polar code to the information word, wherein the codeword comprises a linear combination of the information bits and frozen bits of the polar code, wherein the frozen bits are configured to support a predefined set of automorphisms that provides a mapping of the codeword of the polar code to at least one other codeword of the polar code, and wherein the predefined set of automorphisms is based on a binary upper triangular matrix having a diagonal including at least one of zeros or units; and
   sending the codeword over a communication channel.

2. The encoding apparatus of claim 1, wherein the set of automorphisms comprises affine transformations derived from the binary upper triangular matrix.

3. The encoding apparatus of claim 1, wherein the predefined set of automorphisms is derived based on matrix elements arranged above the diagonal in a vicinity of a bottom right corner of the binary upper triangular matrix.

4. The encoding apparatus of claim 1, wherein the polar code has a code dimension K equal to a number of the information bits of the information word, and wherein the at least one processor is further configured, before generating the codeword, to facilitate the following being performed by the encoding apparatus:
   designing the polar code of the code dimension K by:
   receiving a predetermined polar code having a code dimension K-s, where s<K; and
   increasing the code dimension K-s of the predetermined polar code by adding p information bits to the predetermined polar code at least one time until the polar code of the code dimension K is obtained, where p≤s, and wherein the added p information bits provide an increase in a number of automorphisms of the predetermined polar code.

5. A decoding apparatus, comprising:
a data storage comprising processor-executable instructions; and
at least one processor coupled to the data storage and configured, based on executing the processor-executable instructions, to facilitate the following being performed by the decoding apparatus:
receiving a codeword from a communication channel, wherein the received codeword comprises a linear combination of information bits of an information word and frozen bits of a polar code, wherein the frozen bits are configured to support a predefined set of automorphisms that provides a mapping of the received codeword of the polar code to at least one other codeword of the polar code, and wherein the predefined set of automorphisms is based on a binary upper triangular matrix having a diagonal including at least one of zeros and units;
obtaining a plurality of permuted versions of the received codeword by applying the predefined set of automorphisms to the received codeword;
obtaining a plurality of candidate codewords by decoding each of the permuted versions of the received codeword; and
selecting a candidate codeword from the obtained plurality of candidate codewords.

6. The decoding apparatus of claim 5, wherein selecting the candidate codeword is based on at least one of a maximum-likelihood estimation algorithm or a cyclic redundancy checking algorithm.

7. The decoding apparatus of claim 5, wherein obtaining the plurality of candidate codewords comprises applying successive cancellation-based decoding to the plurality of permuted versions of the received codeword.

8. The decoding apparatus of claim 5, wherein the predefined set of automorphisms comprises affine transformations derived from the binary upper triangular matrix.

9. The decoding apparatus of claim 5, wherein the predefined set of automorphisms is derived based on matrix elements arranged above the diagonal in a vicinity of a bottom right corner of the binary upper triangular matrix.

10. An encoding method, comprising:
receiving, by an encoding apparatus, an information word comprising information bits;
generating, by the encoding apparatus, a codeword by applying a polar code to the information word, wherein the codeword comprises a linear combination of the information bits and frozen bits of the polar code, wherein the frozen bits are configured to support a predefined set of automorphisms that provides a mapping of the codeword of the polar code to at least one other codeword of the polar code, and wherein the predefined set of automorphisms is based on a binary upper triangular matrix having a diagonal including at least one of zeros or units; and
sending, by the encoding apparatus, the codeword over a communication channel.

11. The encoding method of claim 10, wherein the predefined set of automorphisms is derived based on matrix elements arranged above the diagonal in a vicinity of a bottom right corner of the binary upper triangular matrix.

12. A computer program product comprising a non-transitory computer-readable storage medium, wherein the non-transitory computer-readable storage medium stores a computer code which, when executed by at least one processor, causes the at least one processor to perform the method according to claim 10.

* * * * *